(12) United States Patent
White et al.

(10) Patent No.: US 6,311,306 B1
(45) Date of Patent: Oct. 30, 2001

(54) SYSTEM FOR ERROR CONTROL BY SUBDIVIDING CODED INFORMATION UNITS INTO SUBSETS REORDERING AND INTERLACING THE SUBSETS, TO PRODUCE A SET OF INTERLEAVED CODED INFORMATION UNITS

(75) Inventors: Gregory Charles White, Schaumburg; Stephen Paul Emeott, Rolling Meadows, both of IL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/300,419

(22) Filed: Apr. 26, 1999

(51) Int. Cl.[7] .................................................. H03M 13/03
(52) U.S. Cl. ........................................ 714/790; 714/755
(58) Field of Search .................................... 714/790, 755; 375/245, 265, 264, 279, 280; 370/468

(56) References Cited

U.S. PATENT DOCUMENTS

| | | |
|---|---|---|
| 5,029,185 * | 7/1991 | Wei .......................................... 375/245 |
| 5,396,518 * | 3/1995 | How ........................................ 375/265 |
| 5,602,875 * | 2/1997 | Mantel et al. ........................... 375/264 |
| 5,790,570 * | 8/1998 | Heegard et al. ........................ 714/755 |
| 5,850,403 * | 12/1998 | Lasne ..................................... 714/755 |
| 5,850,482 * | 12/1998 | Meany et al. ........................... 382/232 |
| 5,960,040 * | 9/1999 | Cai et al. ................................ 375/279 |

* cited by examiner

*Primary Examiner*—David Ton
(74) *Attorney, Agent, or Firm*—Steven A. May; Jeffrey K. Jacobs

(57) ABSTRACT

The invention provides a method of interleaving information units in order to provide improved error control. A communication device codes the information units, subdivides the coded information units into multiple subsets, reorders each of the multiple subsets, and interlaces the multiple reordered subsets to produce a set of interleaved coded information units. By reordering and interlacing the subsets, the impact of burst errors is diminished and the coded information units are formatted to take advantage of the different levels of error protection provided to the various bits underlying a symbol assigned by a symbol mapper.

17 Claims, 6 Drawing Sheets

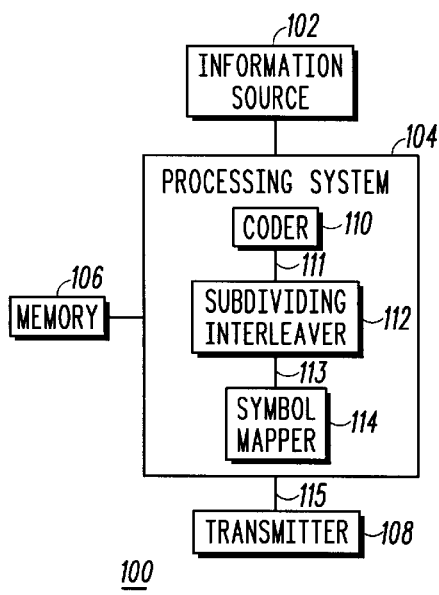
FIG. 1
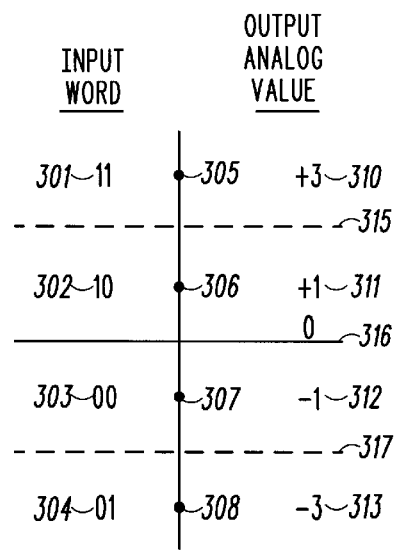
FIG. 3
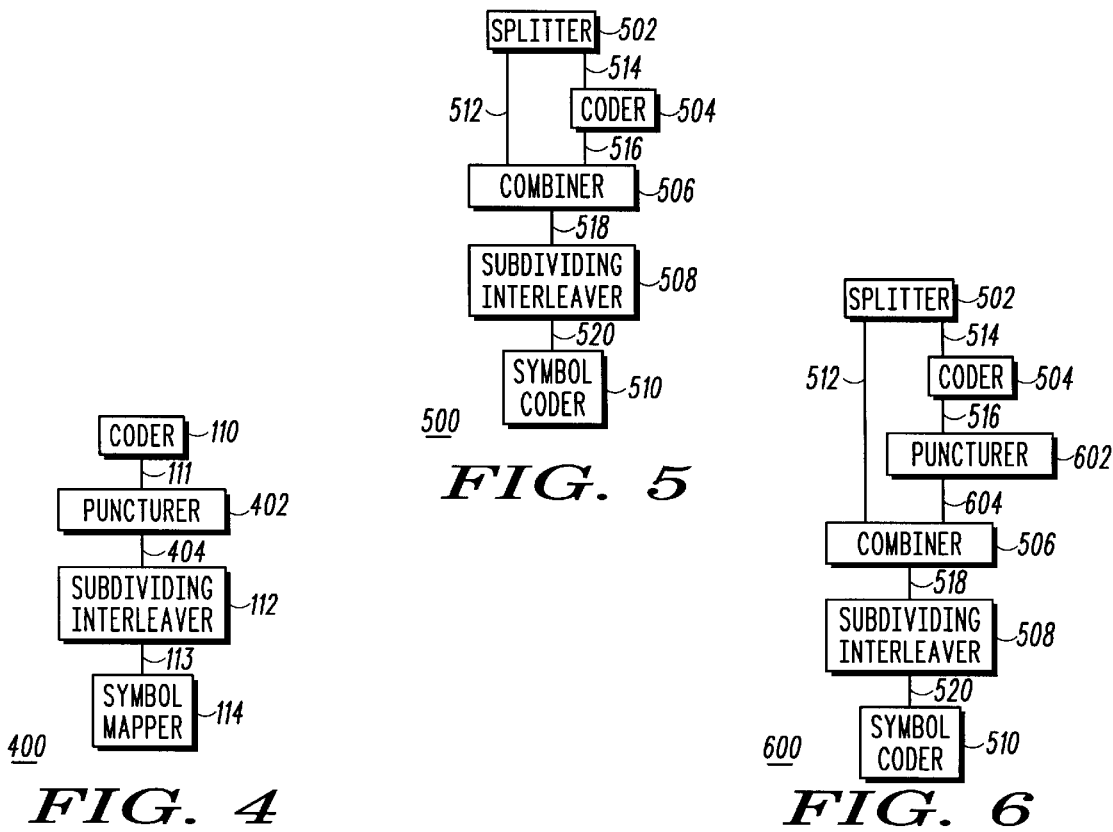
FIG. 4
FIG. 5
FIG. 6

SYSTEM FOR ERROR CONTROL BY SUBDIVIDING CODED INFORMATION UNITS INTO SUBSETS REORDERING AND INTERLACING THE SUBSETS, TO PRODUCE A SET OF INTERLEAVED CODED INFORMATION UNITS

FIELD OF THE INVENTION

The present invention relates generally to wireless communication systems and, in particular, to error control for transmitted information.

BACKGROUND OF THE INVENTION

Errors in the transmission of data can arise from many sources, such as adjacent channel and co-channel interference and undesired distortion in a sending device's transmitter and/or a receiving device's receiver. The result of the introduction of errors is a demodulated bit stream at the receiving communication device (data recipient) that is different from the bit stream that was modulated and transmitted by the sending communication device (data source). One method used to combat this problem is to introduce redundant information, thereby allowing the data recipient to deduce that an error has occurred and to correct the error. The redundant information may consist of additional data bits that are transmitted along with the information bits or may be embedded in binary codewords that are used to represent the information bits. In either case, a portion of the channel bandwidth must be allocated to provide this protection.

In addition to the above-listed sources of error in a transmission channel, mobile radio channels typically experience periodic, transient fading due to multipath propagation effects, which can cause bursts of errors in the demodulated bit stream. To help combat deep fades, interleavers are generally used along with redundant information to break up burst errors into manageable pieces. The interleavers redistribute the data bits contained in a block of data prior to transmission. The combination of adding redundancy to a block of data and interleaving the bits prior to transmission has proven to be a particularly effective method of combatting transmission errors since data containing a burst of errors is more likely to be correctly decoded after the burst has been broken up by the decoder interleaver.

It often happens that there are major differences in importance among the pieces of digital information designed to be transmitted in a block of data. When transporting compressed speech or audiovisual data, for example, often a subset of the data to be transmitted requires significant protection from channel errors, while the rest of the data requires less protection. An encoder that uniformly protects the data using an error protection code designed to protect the most sensitive bits adds excessive redundancy for the less sensitive bits and, as a result, occupies an excessive amount of bandwidth overhead. Such a code is suboptimal in terms of spectral efficiency.

Therefore, the need exists for a method and apparatus for improved error control that provides more error protection for more sensitive data and less error protection for less sentsitive data, thereby reducing the bandwidth consumed by the error control code and maximizing spectral efficiency.

BRIEF DESCRIPTION OF THE DRAWINGS

FIG. 1 is a block diagram of a communication device in accordance with a preferred embodiment of the present invention.

FIG. 3 is an illustration of a constellation of symbols in accordance with a preferred embodiment of the present invention.

FIG. 4 is a block diagram of a processing system of FIG. 1 in accordance with an alternate embodiment of the present invention.

FIG. 5 is a block diagram of a processing system of FIG. 1 in accordance with an alternate embodiment of the present invention.

FIG. 6 is a block diagram of a processing system of FIG. 1 in accordance with an alternate embodiment of the present invention.

DESCRIPTION OF A PREFERRED EMBODIMENT

Figure 2:
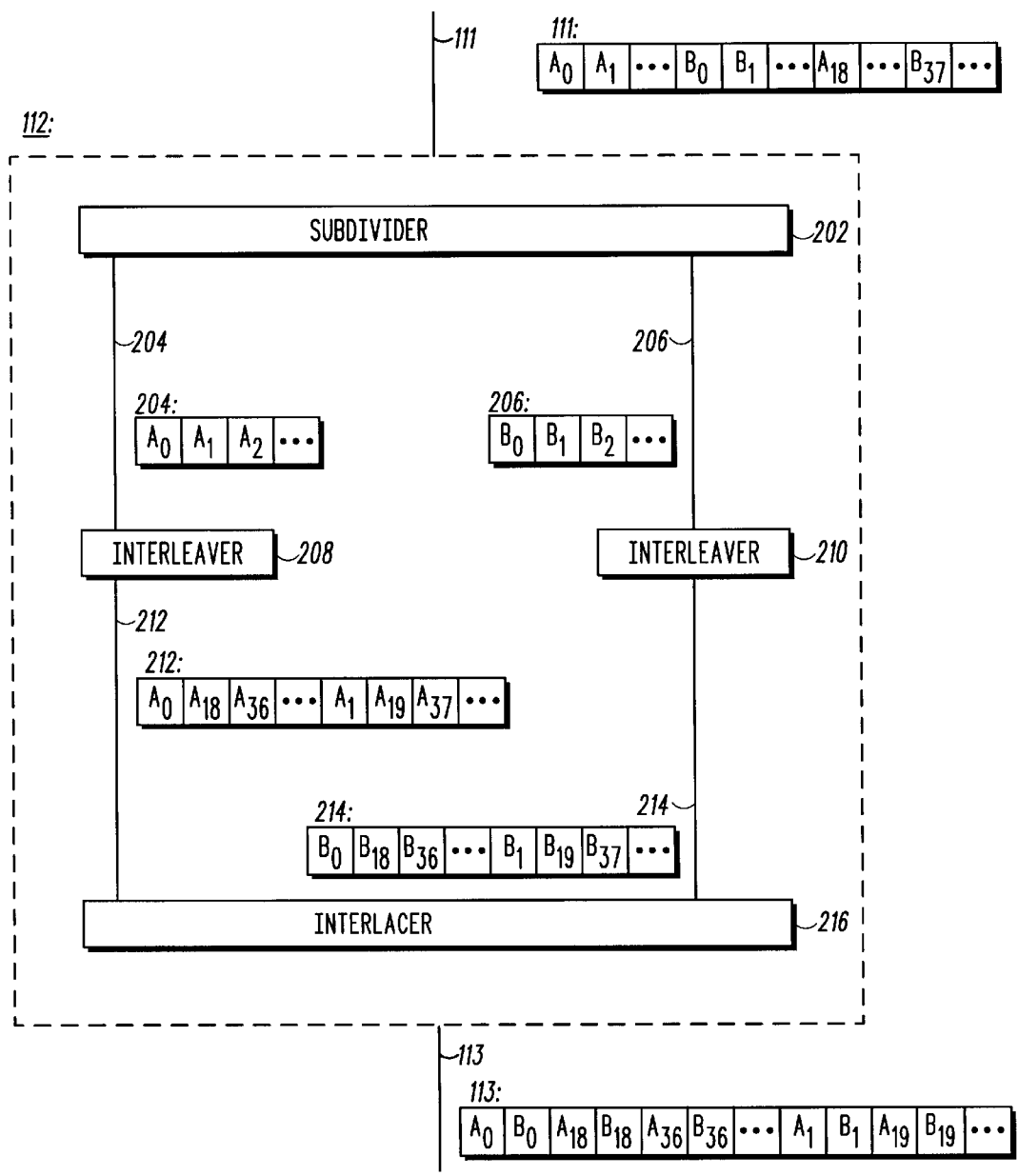
FIG. 2 is a block diagram of a subdividing interleaver of FIG. 1 in accordance with a preferred embodiment of the present invention.

To address the need for a method and apparatus for improved error control that provides more error protection for more sensitive data and less error protection for less sentsitive data, thereby reducing the bandwidth consumed by the error control code and maximizing spectral efficiency, the present invention provides a method of interleaving information units in order to provide improved error control. A communication device codes the information units, subdivides the coded information units into multiple subsets, reorders each of the multiple subsets, and interlaces the multiple reordered subsets to produce a set of interleaved coded information units. By reordering and interlacing the subsets, the impact of burst errors is diminished and the coded information units are formatted to take advantage of the different levels of error protection provided to the various bits underlying a symbol assigned by a symbol mapper.

Generally, the present invention encompasses a method of interleaving information units in order to provide improved error control. The method comprises the steps of receiving multiple information units; subdividing the multiple information units into multiple subsets; reordering information units within each subset to produce multiple reordered subsets, wherein the multiple reordered subsets comprises a first reordered subset and a second reordered subset; and interlacing at least one information unit contained in the first reordered subset with at least one information unit contained in the second reordered subset to produce interleaved coded information units.

Another embodiment of the present invention encompasses a method of transmitting information units by a communication device. The method comprises the steps of providing information units to be transmitted; subdividing the information units into multiple subsets; reordering information units within each subset to produce multiple reordered subsets, wherein the multiple reordered subsets comprises a first reordered subset and a second reordered subset; interlacing at least one information unit contained in the first reordered subset with at least one information unit contained in the second reordered subset to produce interleaved coded information units; and transmitting the interleaved coded information units.

Finally, the present invention encompasses a communication device comprising an information source for providing information units to be transmitted; a processing system, coupled to the information source, wherein the processing system receives the information units, subdivides the information units into multiple subsets, reorders information units within each subset to produce multiple reordered subsets, wherein the multiple reordered subsets comprises a first reordered subset and a second reordered subset, interlaces at least one information unit contained in the first reordered subset with at least one information unit contained in the second reordered subset to produce interleaved coded information units, and assigns a symbol to the interleaved coded information units; and a transmitter, coupled to the processor, wherein the transmitter transmits the symbol.

Turning now to the drawings, wherein like numerals designate like components, FIG. 1 illustrates a communication device in accordance with a preferred embodiment of the present invention. The communication device 100 preferably comprises an "iDEN" radiotelephone and, as shown in FIG. 1, preferably comprises a processing system 104 coupled to an information source 102, to a memory device 106, such as random access memory (RAM), and to a transmitter 108. The processing system 104 preferably comprises a subdividing interleaver 112 coupled to a coder 110 and a symbol mapper 114. In the preferred embodiment, the processing system 104 comprises a processor, such as a microprocessor or a digital signal processor, which processor performs the functions of the coder 110, the subdividing interleaver 112, and the symbol mapper 114.

In the preferred embodiment, the information source 102 is a voice coder that converts an audio signal into data bits and each information unit comprises a data bit. The information source 102 provides information units, preferably a vector of 'K' data bits where K=403, to be transmitted. The information units are provided to the coder 110, which applies an error control code of rate 'R' to produce a set of coded information units 111. Preferably, the set of coded information units 111 comprises a code vector comprising 'N' code bits, where N=K/R. In the preferred embodiment, the coding rate 'R' varies among 1/3 (three code bits are produced for one input data bit), 4/7 (seven code bits are produced for four input data bit), and 1/1 (one code bit is produced for one input data bit), resulting in a value for 'N' of 664. However, those of ordinary skill in the art will know that coding rates other than 1/3, 4/7, and 1/1 may be used as well as a value for 'K' other than 403 and a value for 'N' other than 664, and that other channel coding methods, as there are many convolutional coding methods and block coding methods known in the art, may be used without departing from the spirit and scope of the present invention.

The code vector 111 is conveyed to the subdividing interleaver 112 which reorders the code bits within the code vector 111, according to a method described in more detail below, to produce interleaved coded information units 113. Preferably, the interleaved coded information units 113 comprises an interleaved vector comprising 'N' code bits. The interleaved vector 113 is then provided to the symbol mapper 114. The symbol mapper 114 takes as input the interleaved vector 113, assigns a symbol 115, preferably an analog symbol, to multiple code bits in the interleaved vector 113, and outputs the symbol 115. The transmitter 108 transmits the symbol 115, preferably by modulating the symbol 115 onto a waveform by mixing the symbol 115 and the waveform and transmitting the modulated waveform. Other methods of modulating waveforms are well-known to those of ordinary skill in the art and may be used without departing from the spirit and scope of the present invention.

As described below, the probability of erroneously decoding a bit of the multiple code bits assigned a symbol, when the symbol is received, varies with position of the bit among the multiple bits. The present invention provides improved error control with reduced bandwidth overhead by utilizing the variations in probability of a received bit error. The subdividing interleaver 112 reorders the code bits in the code vector 111 so that when the symbol 115 is assigned to the multiple bits, a more important bit is in a lower probability of error position among the multiple bits and a less important bit is in a higher probability of error position. By utilizing the variation in error probability among the bit positions, the invention eliminates the need to code all data bits at the rate required for the most important bits. Instead, data bits can be coded at a lesser rate and additional error protection is provided for the more important bits by placing the more important bits in the lower error probability bit positions.

FIG. 2 illustrates a preferred embodiment of the subdividing interleaver 112. In the preferred embodiment, the subdividing interleaver 112 comprises a subdivider 202, multiple interleavers 208, 210, (two shown) and an interlacer 216. The subdivider 202 receives the code vector 111 from the coder 110 (for purposes of illustration only, the code vector 111 is shown comprising the set ($A_0, A_1, \ldots, B_0, B_1, \ldots, A_{18}, \ldots, B_{37}, \ldots$), wherein $A_0, A_1, \ldots$ are more important code bits and $B_0, B_1, \ldots$ are less important code bits). The subdivider 202 divides the code vector 111 into multiple subsets of code bits 204, 206, (two shown) (e.g., subset 204 comprises the ordered subset ($A_0, A_1, A_2, \ldots$), and subset 206 comprises the ordered subset ($B_0, B_1, B_2, \ldots$)) wherein the subsets 204, 206 are mutually exclusive and collectively exhaustive. Preferably, the code bits in subset 204 require a lower probability of bit-error than the code bits in subset 206. For example, in voice encoding algorithms, audio sounds are converted to a stream of data bits, which bits vary with respect to their importance in reproducing the audio quality of the voice. The data bits are converted to code bits, and code bits more important to an accurate reproduction of voice quality are assigned to subset 204 and code bits less important to an accurate reproduction of voice quality are assigned to subset 206.

Each subset of code bits 204, 206 is then reordered by an interleaver of the multiple interleavers 208, 210 to produce multiple reordered subsets of code bits, wherein the reordered subsets of code bits comprises a first reordered subset 212 and a second reordered subset 214. For example, the subset 204 (e.g., the ordered subset ($A_0, A_1, A_2, \ldots$)) is reordered by interleaver 208 to produce the first reordered subset of code bits 212 (e.g., reordered subset ($A_0, A_{18}, A_{36}, \ldots, A_1, A_{19}, A_{37}, \ldots$)) and the subset 206 (e.g., the ordered subset ($B_0, B_1, B_2, \ldots$)) is reordered by interleaver 210 to produce the second reordered subset of code bits 214 (e.g., reordered subset ($B_0, B_{18}, B_{36}, \ldots, B_1, B_{19}, B_{37}, \ldots$)). The multiple reordered subsets 212, 214 are then combined by the interlacer 216 to produce the interleaved vector 113 (e.g., set ($A_0, B_0, A_{18}, B_{18}, A_{36}, B_{36}, \ldots, A_1, B_1, \ldots$)), which interleaved vector 113 comprises an output set of code bits.

In an alternate embodiment of the present invention, the information units may be provided by the information source 102 to the subdividing interleaver 112. The subdividing interleaver's subdivider 202 subdivides the information units into multiple uncoded subsets. The multiple uncoded subsets are conveyed to the coder 110, and the coder 110 codes each uncoded subset to produce the multiple subsets of code bits 204, 206. Each subset of code bits 204, 206 is then conveyed to an interleaver of the multiple interleavers 208, 210 and processed as described above in the preferred embodiment.

Preferably, the interleavers 208, 210 are designed collectively to ensure that certain relationships exist between the order of code bits in the code vector 111 and the order of code bits in the interleaved vector 113. One relationship relates to a pairwise distance of the code bits in the code vector 111 relative to a pairwise distance of the code bits in the interleaved vector 113. For example, it might be decided that two code bits which are located closer than 'C' bit positions from each other in the code vector must be located farther than 'C' bit positions from each other in the interleaved vector 113. The parameter 'C' represents a number of bit positions that is large enough to ensure that burst errors are properly distributed by the subdividing interleaver 112.

Each interleaver of the plurality of interleavers 208, 210 can be any kind of interleaver, such as a block interleaver or a random interleaver, so long as each interleaver 208, 210 changes the pairwise distance of the bits in the code vector 111 relative to the pairwise distance of the bits in the interleaved vector 113. In the preferred embodiment, interleaver 208 is designed as a block interleaver of dimensions appropriate to a size of the first subset of code bits 204 and interleaver 210 is designed as a constrained random interleaver. The constrained random interleaver 210 consists of a table of length equal to a size of the subset of code bits 206. The table contains indices which reference each code bit of the subset of code bits 206. The order of the indices in the table correspond to the order of the output of interleaver 210 (i.e., the reordered subset of code bits 214). The table is created by selecting, at random and without replacement, one bit at a time from a list of available indices. The list of available indices begins containing the indices 1 through 'P', where 'P' is a bit size of the subset of code bits 206. When each code bit is selected from the list of available indices, the code bit is subjected to a set of fitness criteria. If the selected code bit passes the fitness criteria, it is appended to the end of the table. If the selected code bit fails the fitness criteria, it is replaced in the list of available indices and other code bits are selected at random until a code bit is found which passes the fitness criteria. The fitness criteria are based on the pairwise distance properties described above. A selected code bit fails the criteria if it causes the subdividing interleaver 112 to violate the property that any two bits which are located closer than 'C' bit positions from each other in the code vector 111 are located farther than 'C' bit positions from each other in the interleaved vector 113. If a selected bit does not cause the subdividing interleaver 112 to violate that property, then it passes the fitness criteria. Preferably, the parameter 'C' is chosen to be as large as is practical.

The interlacer 216 selects code bits, individually or in groups, alternately from the first reordered subset 212 and the second reordered subset 214 and positions each selected code bit or group of selected code bits in a bit position or group of bit positions, respectively, in the interleaved vector 113. In the preferred embodiment, the interlacer 216 produces the interleaved vector 113 by alternately selecting individual code bits from the first reordered subset 212 and from the second reordered subset 214 and positioning each pair of alternately selected bits in adjacent bit positions in the interleaved vector 113.

In the case where the first reordered subset of code bits 212 contains the same number of bits as the second reordered subset of code bits 214, the interlacer 216 preferably would produce the interleaved vector 113 by selecting, in order, the first member of each of the reordered subsets 212, 214, and positioning the selected code bits in adjacent bit positions in the interleaved vector 113, followed by selecting, in order, the second member of each of the reordered subsets 212, 214 and positioning the selected code bits in the next available adjacent bit positions in interleaved vector 113, and continuing in this fashion until all members of each of the reordered subsets 212, 214 have been exhausted.

In the preferred embodiment, the symbol mapper 114 is a Gray code symbol mapper of order 'D.' The Gray code symbol mapper 114 applies a Gray code to the interleaved vector 113 and outputs at least one symbol 115 and preferably a symbol vector of 'L' symbols where L=N/D. The value of 'D' is determined based on the number of symbols ($2^D$) in a predetermined constellation of symbols, with the result that there are $2^D$ distinct D-bit words that may be represented by the symbols in the constellation. The 'L' symbols are produced by taking 'D' consecutive bits of the interleaved vector 113 and forming a word, eventually forming a set of 'L' words where each word consists of 'D' bits (e.g., where D=2, bit pairs '$A_0, B_0$' and '$A_{18}, B_{18}$' of the interleaved vector 113 would each constitute a word). The value of 'L' can be calculated based on L×D equaling the number of bits in the interleaved vector 113. In the preferred embodiment, D=2 and L=N/D=332. The values of the bits in each word of the 'L' words are then used to select an output symbol from the constellation, where each symbol in the constellation is associated with each word in the set of $2^D$ distinct D-bit words on a one-to-one basis and where each symbol comprises a discrete analog value. Also, a further restriction on the word-symbol association of the Gray code symbol mapper 114 is that the words associated with pairs of nearest-neighbor symbols in the constellation (in terms of Euclidean distance in the plane of the constellation) differ in only a single bit position.

FIG. 3 is an illustration of a constellation of symbols 300 in accordance with a preferred embodiment of the present invention. The constellation 300 represents a 4-ary Amplitude Modulation (4-AM) scheme. In 4-AM, D=2 so there are four possible 2-bit words 301–304 (i.e., 11, 10, 00, and 01), and four defined symbols 305–308 that each correspond with one of the four possible 2-bit words and that also correspond with one of four possible analog values 310–313 (i.e., +3, +1, −1, and −3 volts). Alternatively, the Gray code symbol mapper 114 might utilize any modulation scheme in which symbols may be represented as a single or multi-dimensional constellation, such as 16-ary Quadrature Amplitude Modulation (16-QAM), 8-ary Phase Shift Keying (8-PSK), 64-QAM, and 128-QAM.

Symbols transmitted by a sending communication device (data source) often get corrupted by noise and interference before being received by a receiving communication device (data recipient), perturbing received symbols some distance from the values of the transmitted symbols. As a result, it is useful to define decision boundaries for the received symbols, so as to best determine what was transmitted. In the preferred embodiment, each 2-bit word 301–304 has a most significant bit, i.e., a first bit (e.g., $A_0$ and $A_{18}$ in the words $A_0$, $B_0$, and $A_{18}$, $B_{18}$) and a least significant bit, i.e., a second bit (e.g., $B_0$ and $B_{18}$ in the words $A_0$, $B_0$, and $A_{18}$, $B_{18}$). The most significant bit has a single decision boundary 316 at an analog value of zero. If a received symbol has a value greater than zero (e.g., symbols 305, 306), the receiver will determine that the most significant bit in the word associated with that symbol was a binary 1. If the received symbol has a value less than zero (e.g., symbols 307, 308), the receiver will make the opposite determination (i.e., a binary 0). The least significant bit has two decision boundaries 315, 317 at the analog values +2 and −2. If a certain received symbol has a value between the two boundaries 315, 317 (e.g. symbols 306, 307), the receiver will make the determination that the least significant bit in the word associated with that symbol was a binary 0. If the received symbol has a value outside of the two boundaries 315, 317 (e.g., symbols 305, 308), the receiver makes the opposite determination (i.e., a binary 1).

In certain transmission channels, most notably additive Gaussian noise channels, the probability that a transmitted symbol will be incorrectly received is inversely related to the distance that symbol lies from the decision boundaries defined in the receiver. The same is true of the individual bits represented by that symbol. For additive white Gaussian noise channels, the relationship between the probability of bit-error $P_{be}$ and the distance between the transmitted symbol and the appropriate decision boundary is given by:

$$P_{be}(x) = \frac{1}{2} \text{erfc}\left(\frac{x}{\sqrt{N_0}}\right)$$

where 'x' is the distance to the decision boundary, '$N_0$' is the variance of the channel noise process, and 'erfc' is the well-known "complimentary error function" defined as:

$$\text{erfc}(z) = \frac{2}{\sqrt{\pi}} \int_z^\infty e^{-u^2} du$$

When more than one decision boundary exists, the relationship between $P_{be}$ and the distances between the transmitted symbol and the decision boundaries becomes somewhat more complicated, but since the erfc is a very rapidly diminishing function (in fact it diminishes faster than exp $(-z^2)$) in many cases only the closest decision boundary is important in determining the probability of bit-error.

In the preferred embodiment, the decision boundary for the most significant bit (i.e., decision boundary 316) lies at a distance of either 1 or 3 from a transmitted symbol (depending on which symbol was transmitted), while the closest decision boundary for the least significant bit (i.e., decision boundaries 315, 317) always lies at a distance of 1 from a transmitted symbol, regardless of which symbol was transmitted. Assuming all symbols 305–308 are equally likely to have been transmitted, and due to the rapidly diminishing nature of the $P_{be}$ equation, a least significant bit is almost twice as likely to be in error as a most significant bit.

In the preferred embodiment, which utilizes 4-AM signalling, all of the bits from interleaver 208, when passed to the symbol mapper 114, end up in the bit positions corresponding to the bits with lower $P_{be}$ (strong bits, i.e., bits that are a most significant bit, or first bit, in a 2-bit word), and all of the bits from interleaver 210 end up in the bit positions corresponding to the bits with higher $P_{be}$ (weak bits, i.e., bits that are a least significant bit, or second bit, in a 2-bit word). Better system performance is achieved by giving the more important bits stronger error protection than the less important bits.

For illustrative purposes, the subdivider 202 of the subdividing interleaver 112 provides four different levels of protection for each data bit and a coding rate R=1/3. For the most important code bits, the subdivider 202 assigns all three bits to the strong bit interleaver 208. For the least important code bits, the subdivider 202 assigns all three bits to the weak bit interleaver 210. For code bits of intermediate importance, the subdivider 202 assigns different proportions of the three code bits to either the strong bit interleaver 208 or the weak bit interleaver 210. Preferably, the total number of bits in the strong bit interleaver 208 is the same as that in the weak bit interleaver 210.

In general, the present invention provides improved error control with reduced bandwidth overhead by utilizing variations in probability of a received bit error among the multiple code bits assigned a symbol. The subdividing interleaver 112 reorders the code bits in the code vector 111 so that when a symbol 115 is assigned to the multiple bits, each more important bit is in a lower probability of error postion among the multiple bits and each less important bit is in a higher probability of error position. Preferably, this is accomplished by taking the code bits of the code vector 111 (e.g., $A_0, A_1, \ldots, B_0, B_1, \ldots, A_{18}, \ldots, B_{37}, \ldots$), subdividing the vector into two subsets (e.g., a first subset $A_0, A_1, A_2, \ldots$, and a second subset $B_0, B_1, B_2, \ldots$), the first subset being the more important bits and the second subset being the less important bits, reordering each subset (e.g., the first subset is reordered $A_0, A_{18}, A_{36}, \ldots, A_1, A_{19}, A_{37}, \ldots$, and the second subset is reordered $B_0, B_{18}, B_{36}, \ldots, B_1, B_{19}, B_{37}, \ldots$) in order to minimize the impact of burst errors, interlacing the two reordered subsets by alternately selecting bits from each reordered subset and positioning the selected bits in adjacent positions in an interleaved vector 113 (e.g., $A_0, B_0, A_{18}, B_{18}, A_{36}, B_{36}, \ldots, A_1, B_1, \ldots$), and assigning a symbol from a constellation of $2^D$ (D=2) symbols to each of the D-bit 'words' of the interleaved vector 113 (e.g., assigning a symbol to each of the words $A_0, B_0$ and $A_{18}, B_{18}$ and . . . ).

As described above, decision boundaries are used to decode the received symbols, i.e., to determine what bits were transmitted by a data source when a symbol is received by a data recipient. The decision boundaries result in a lower probability of error in the decoding of the first bit of each 2-bit word than in the decoding of the second bit. By placing the more important bits (e.g., the bits from the first subset $A_0, A_1, A_2, \ldots$) in the first bit position in each 2-bit word and the less important bits (e.g., the bits from the second subset $B_0, B_1, B_2, \ldots$) in the second bit position in each 2-bit word, the invention provides additional error control for the more important bits. Thus, the need to code all data bits at the coding rate required for the most important bits is eliminated and the bandwidth required for error control is reduced. Instead, data bits can be coded at a lesser rate and additional error control is provided for the more important bits by placing them in the lower error probability bit positions.

FIG. 4 illustrates an alternate embodiment of the processing system 104. A processing system 400 as described in FIG. 4 is identical to the processing system 104 described in FIG. 1 except for the addition of a puncturer 402 coupled between the coder 110 and the subdividing interleaver 112. The functioning of the coder 110, the subdividing interleaver 112, and the symbol mapper 114 are identical to their functioning as described above with respect to FIG. 1. The coder 110 receives the information units from the information source and produces a code vector 111 of 'N' code bits. The puncturer 402, takes as input the code vector 111 and outputs a punctured vector 404 of 'M' code bits (K<M<N), which punctured vector 404 comprises a predetermined subset of the 'N' code bits of the code vector 111. The remainder of the 'N' code bits not included in the punctured vector 404 are discarded. Preferably, the puncturing (i.e., bit removal) is done such that the most redundancy is provided to those code bits associated with the most important data bits. The code bits which are less important are punctured more heavily to reduce a bandwidth overhead required to transmit the information units. The cost of the reduction in redundancy is a reduction in noise immunity and an increase in bit error probability at a receiver for the less important data bits. However, this is a desirable tradeoff in exchange for reducing the bandwidth overhead. The punctured vector 404 is then provided to the subdividing interleaver 112, and the subdividing interleaver 112 processes the punctured vector 404 in the same manner as the subdividing interleaver 112 processes the code vector 111 above in FIG. 1.

FIG. 5 illustrates a second alternate embodiment of the processing system 104. In some applications, the information units include some bits which are considered much less important than the other bits. In this type of application, it is sometimes advantageous to transmit the very low importance data bits with no error control coding whatsoever. This allows the budget for error control to be spread over the remaining bits in a more generous manner. In the second alternate embodiment, a processing system 500 comprises a splitter 502 coupled to a combiner 506, a coder 504 coupled to the splitter 502 and the combiner 506, a subdividing interleaver 508 coupled to the combiner 506, and a symbol coder 510 coupled to the subdividing interleaver 508. The splitter 502 separates the information units (e.g., the 'K' data bits) into two sets: a set of uncoded information units 512, preferably a set comprising 'U' data bits, and a set of codeable information units 514, preferably a set comprising 'V' data bits, where K=U+V. The values of 'U' and 'V' are determined by the number of much less important data bits ('U'). The coder 504 (with a coding rate 'R') takes the set of codeable data bits 514 ('V' data bits) and produces a set of coded codeable data bits 516 comprising 'S' code bits, where S=V/R. The combiner 506 combines the set of uncoded data bits 512 ('U' data bits) and set of coded codeable data bits 516 ('S' code bits) to produce coded information units 518 that preferably comprise 'J' bits, where J=U+S. The coded information units 518 are then provided to the subdividing interleaver 508 which produces an interleaved vector 520 of 'J' bits and conveys the interleaved vector 520 to the symbol coder 510. The subdividing interleaver 508 and the symbol coder 510 operate indentically to the subdividing interleaver 112 and the symbol coder 114 of FIG. 1. Preferably, the subdivider 202 of the subdividing interleaver 508 assigns all of the 'U' bits in the set of uncoded data bits 512 to the interleaver whose bits end up, when provided to the symbol coder 510, in the positions with highest $P_{be}$. This leaves the bit positions with stronger noise immunity (i.e., lower $P_{be}$) to be used by the bits of the set of coded codeable data bits 516. The interleaved vector 520 is provided to the symbol coder 510, which outputs a symbol string.

FIG. 6 illustrates a third alternate embodiment of the processing system 104. The third alternate embodiment is identical to the second alternate embodiment, as described above in FIG. 5, except that a puncturer 602 is coupled between the coder 504 and the combiner 506. The operation of a processing system 600 in third alternate embodiment is identical to the operation of the processing system 500 described in FIG. 5, except that in the third alternate embodiment the output of the coder 504, i.e., the set of coded codeable information units 516, is conveyed to the puncturer 602. The puncturer 602 punctures the set of coded codeable information units 516 to produce a punctured set of coded codeable information units 604, preferably a punctured vector comprising a punctured set of coded codeable data bits. The punctured vector 604 is conveyed to the combiner 506. The combiner 506 combines the uncoded data bits 512 and the punctured vector 604 to produce a set of coded information units 518. The coded information units 518 is then provided to the subdividing interleaver 508. The subdividing interleaver 508 produces an interleaved vector 520 that is provided to the symbol coder 510, which outputs at least one symbol. In the third alternate embodiment, the puncturer 602 is used to reduce the redundancy in the code vector 516 (of 'S' code bits) in order to meet a bandwidth overhead constraint, with the result that the most redundancy is provided to those data bits which are most important.

In general, the alternate embodiments of the present invention further reduce the bandwidth overhead used for error control by puncturing vectors of code bits and by not coding much less important data bits.

Figure 7:
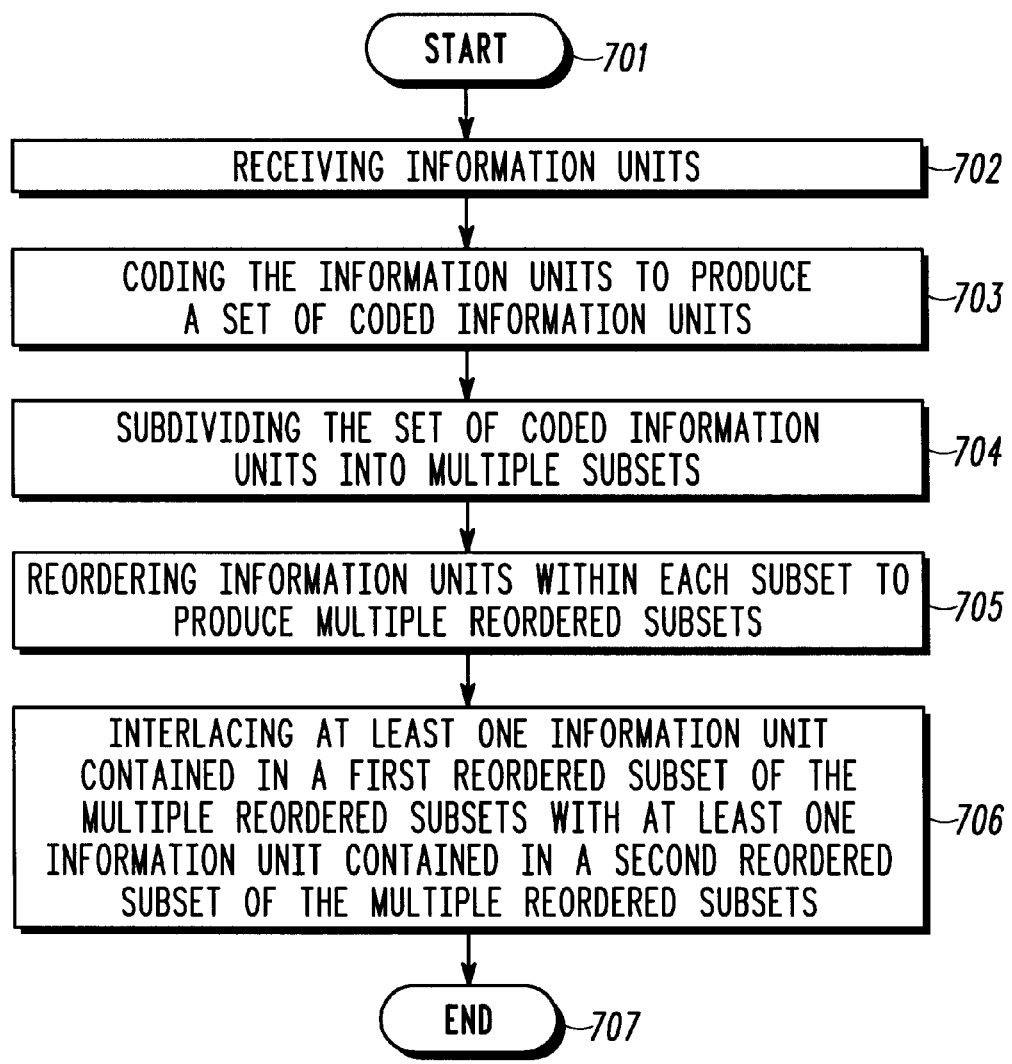
FIG. 7 is a logic flow diagram of the steps executed by a communication device to interleave information units in accordance with a preferred embodiment of the present invention.

FIG. 7 is a logic flow diagram of steps executed by a communication device to interleave information units in order to provide improved error control in accordance with a preferred embodiment of the present invention. The logic flow begins (701) when the communication device receives (702) multiple information units. The communication device codes (703) the information units to produce a set of coded information units, and subdivides (704) the set of coded information units into multiple subsets of coded information units. The communication device reorders (705) coded information units within each subset of the multiple subsets to produce multiple reordered subsets of coded information units, wherein the multiple reordered subsets comprises a first reordered subset and a second reordered subset. The communication device interlaces (706) at least one information unit contained in the first reordered subset with at least one information unit contained in the second reordered subset to produce interleaved coded information units, and the logic flow ends (707).

Figure 8:
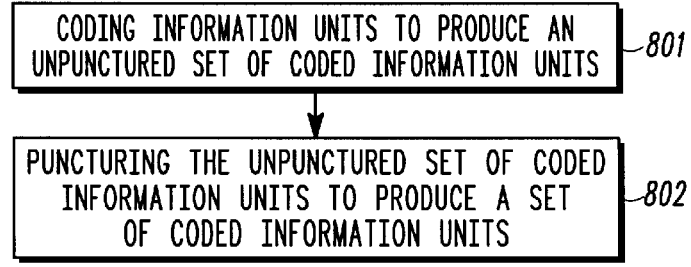
FIG. 8 is a logic flow diagram of steps executed by a communication device to code information units in accordance with a alternate embodiment of the present invention.

FIG. 8 is a logic flow diagram of steps executed by a communication device to code information units in accordance with a first alternate embodiment of the present invention as described in FIG. 7. In the alternate embodiment, the step of coding (703) the information units comprises the steps of coding (801) the information units to produce an unpunctured set of coded information units and puncturing (802) the unpunctured set of coded information units to produce a set of coded information units.

Figure 9:
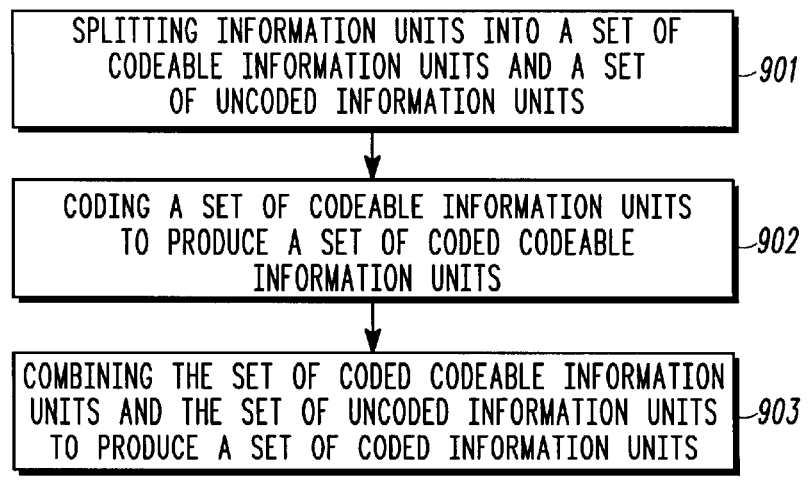
FIG. 9 is a logic flow diagram of steps executed by a communication device to code information units in accordance with an alternate embodiment of the present invention.

FIG. 9 is a logic flow diagram of steps executed by a communication device to code information units in accordance with a second alternate embodiment of the present invention as described in FIG. 7. In the second alternate embodiment, the step of coding (703) information units comprises the steps of splitting (901) the information units into a set of codeable information units and a set of uncoded information units, coding (902) the set of codeable information units to produce a set of coded codeable information units, and combining (903) the set of coded codeable information units and the set of uncoded information units to produce a set of coded information units.

Figure 10:
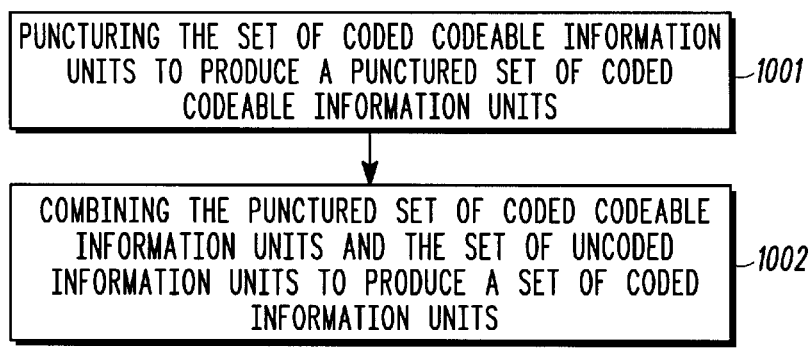
FIG. 10 is a logic flow diagram of steps executed by a communication device to combine a set of coded codeable information units and a set of uncoded information units in accordance with an alternate embodiment of the present invention.

FIG. 10 is a logic flow diagram of steps executed by a communication device to combine the set of coded codeable information units and the set of uncoded information units in accordance with a third alternate embodiment of the present invention as described in FIG. 9. In the third alternate embodiment, the step of combining (903) comprises the steps of puncturing (1001) the set of coded codeable information units to produce a punctured set of coded codeable information units and combining (1002) the punctured set of coded codeable information units and the set of uncoded information units to produce a set of coded information units.

In general, the present invention as described in FIG. 7 provides a method of interleaving information units in order to provide improved error control. As described above, a communication device codes information units, subdivides the coded information units into multiple subsets, reorders each of the multiple subsets, and interlaces the multiple reordered subsets to produce a set of interleaved coded information units. By reordering and interlacing the subsets, the impact of burst errors is diminished and the coded information units are formatted to take advantage of the different levels of error protection provided to the various bits underlying a symbol assigned by a Gray code symbol mapper. By taking advantage of the different levels of error protection provided by the Gray code symbol mapper, the bandwidth overhead required for error protection may be reduced. Further bandwidth overhead reduction may be obtained by not coding a portion of the information units and by puncturing coded information units.

Figure 11:
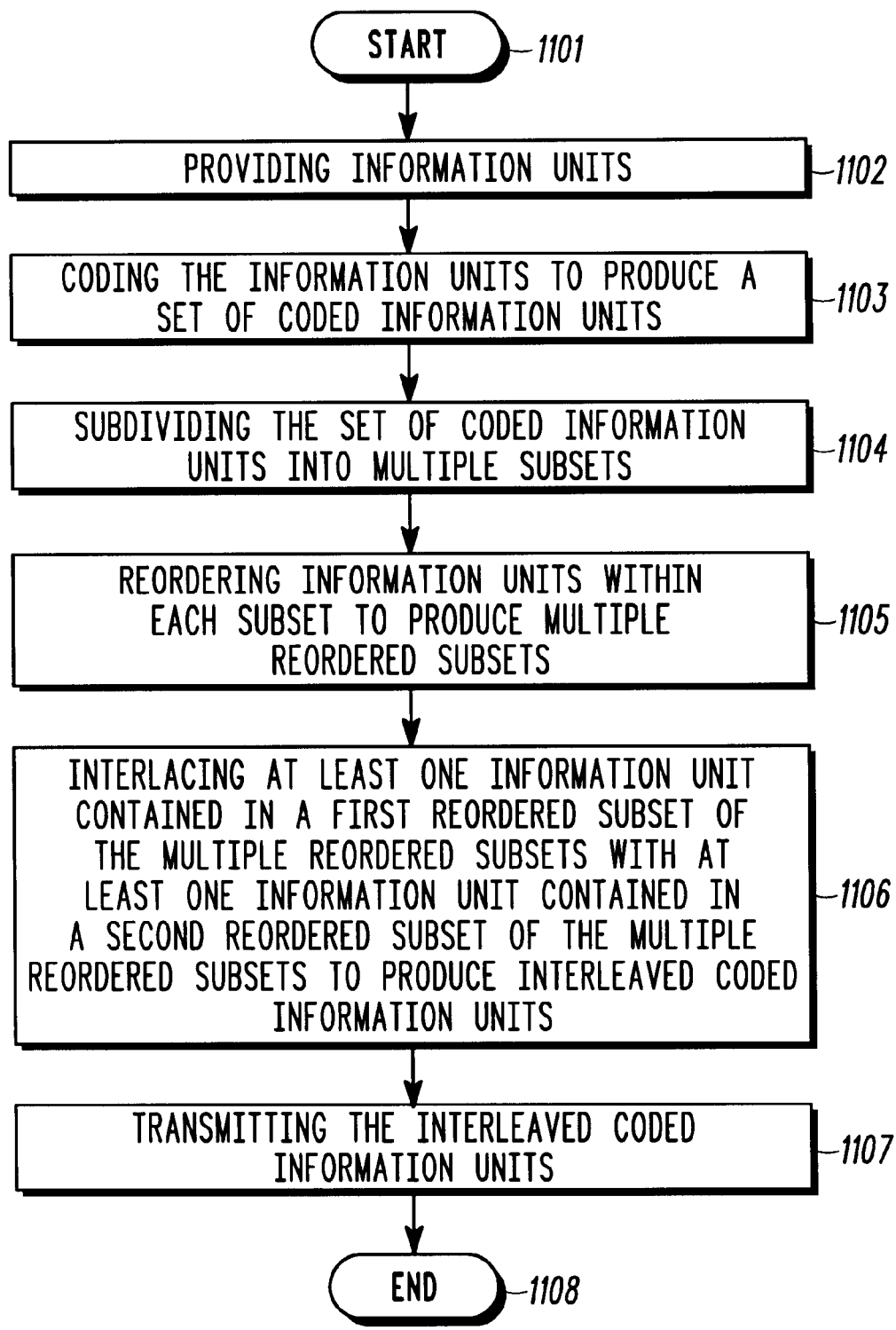
FIG. 11 is a logic flow diagram of the steps executed by a communication device to transmit information units in accordance with a preferred embodiment of the present invention.

FIG. 11 is a logic flow diagram of the steps executed by a communication device to transmit information units in accordance with a preferred embodiment of the present invention. In the preferred embodiment, the logic flow begins (1101) when the communication device (1102) provides information units to be transmitted. The communication device codes (1103) the information units to produce a set of coded information units and subdivides (1104) the set of coded information units into multiple subsets of coded information units. The communication device reorders (1105) coded information units within each subset to produce multiple reordered subsets of coded information units, wherein the multiple reordered subsets comprises a first reordered subset and a second reordered subset. The communication device then interlaces (1106) at least one information unit contained in the first reordered subset with at least one information unit contained in the second reordered subset to produce interleaved coded information units and transmits (1107) the interleaved coded information units, and the logic flow ends (1108).

Figure 12:
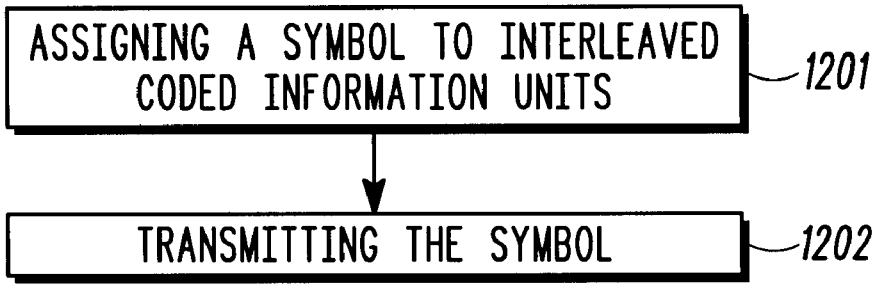
FIG. 12 is a logic flow diagram of steps executed by a communication device to transmit interleaved coded information units in accordance with an alternate embodiment of the present invention.

FIG. 12 is a logic flow diagram of the steps executed by a communication device to transmit interleaved coded information units in accordance with a preferred embodiment of the present invention. In FIG. 12, the step of transmitting (1107) interleaved coded information units comprises the steps of assigning (1201) a symbol, preferably based on a Gray code, to the interleaved coded information units and transmitting (1202) the symbol.

In a first alternate embodiment of the present invention as described in FIG. 11, the step of coding (1103) the information units comprises the steps of coding (801) the information units to produce an unpunctured set of coded information units and puncturing (802) the unpunctured set of coded information units to produce a set of coded information units.

In a second alternate embodiment of the present invention as described in FIG. 11, the step of coding (1103) the information units comprises the steps of splitting (901) the information units into a set of codeable information units and a set of uncoded information units, coding (902) the set of codeable information units to produce a set of coded codeable information units, and combining (903) the set of coded codeable information units and the set of uncoded information units to produce a set of coded information units.

In a third alternate embodiment of the present invention as described in FIG. 11, the step of combining (903), as described in the second alternate embodiment of the present invention as described in FIG. 11, comprises the steps of puncturing (1001) the set of coded codeable information units to produce a punctured set of coded codeable information units and combining (1002) the punctured set of coded codeable information units and the set of uncoded information units to produce a set of coded information units.

Figure 13:
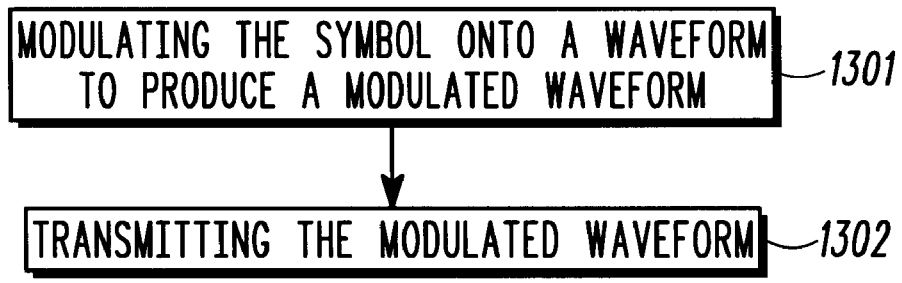
FIG. 13 is a logic flow diagram of steps executed by a communication device to transmit a symbol in accordance with an alternate embodiment of the present invention.

FIG. 13 is a logic flow diagram of steps executed by a communication device to transmit a symbol in accordance with a fourth alternate embodiment of the present invention as described in FIG. 12. In the fourth alternate embodiment, the step of transmitting (1202) the symbol comprises the steps of modulating (1301) the symbol onto a waveform to produce a modulated waveform and transmitting (1302) the modulated waveform.

In general, the present invention as described in FIG. 11 provides a method of transmitting information units with improved error control. As described above, a communication device codes the information units, subdivides the coded information units into multiple subsets of coded information units, reorders each of the multiple subsets, interlaces the multiple reordered subsets to produce a set of interleaved coded information units, and transmits the interleaved coded information units. Preferably, the interleaved coded information units is assigned at least one symbol by a Gray code symbol mapper and the symbol is transmitted. By reordering and interlacing the subsets, the impact of burst errors is diminished and the coded information units are formatted to take advantage of the different levels of error protection provided to the various bits underlying a symbol assigned by the Gray code symbol mapper. By taking advantage of the different levels of error protection provided by the Gray code symbol mapper, the bandwidth overhead required for error protection may be reduced. Further bandwidth overhead reduction may be obtained by not coding a portion of the information units and by puncturing coded information units.

Generally, the present invention provides an apparatus and method for improved error control that provides more error protection for more sensitive data and less error protection for less sentsitive data, thereby reducing the bandwidth consumed by the error control code and maximizing spectral efficiency. The method and apparatus separates a limited resource (the bandwidth), or a set of bits, into multiple limited resources, or multiple subsets of bits, wherein the multiple subsets of bits have different requirements with respect to susceptibility to channel errors, resulting in one subset of bits being protected more strongly than the other subset of bits. In the preferred embodiment of the present invention, a coded vector is subdivided into a vector of more important bits and a vector of less important bits. The bits in each vector are reodered to minimize the impact of burst errors and then the bits from the two vectors are interlaced to produce an interleaved vector. The bits in the interleaved vector are grouped into multiple-bit 'words' and each word is assigned a symbol for subsequent transmission.

When the symbol is received by a data recipient, the probability that there will be an error in a bit decoded from the received symbol varies with the position of the bit in the underlying word. The invention places a more important bit in a position in the interleaved vector that will result in the bit being selected for a lower error probability position in a word, and a less important bit in a position in the interleaved vector that will result in the bit being selected for a higher error probability position in a word. By utilizing the variation in error probability among the bit postions in a word, the invention eliminates the need to code all data bits at the rate required for the most important bits. Instead, data bits can be coded at a lesser rate and additional error protection is provided for the more important bits by placing them in the lower error probability positions of words to be assigned symbols. The invention provides improved bit error rate performance to the more important bits, at the expense of degraded bit error rate performance for the less important bits but in exchange for a reduction in bandwidth overhead. In many applications, such as compressed digital speech where a subset of the bitstream is often very insensitive to bit errors, this is a favorable tradeoff.

While the present invention has been particularly shown and described with reference to particular embodiments thereof, it will be understood by those skilled in the art that various changes in form and details may be made therein without departing from the spirit and scope of the present invention.

We claim:

1. A method of interleaving information units in order to provide improved error control, the method comprising the steps of:
   receiving a plurality of information units;
   subdividing the plurality of information units into a plurality of subsets, wherein the information units subdivided into at least one of the plurality of subsets require a lower probability of bit-error than the information units subdivided into another of the plurality of subsets;
   reordering information units within each subset to produce a plurality of reordered subsets, wherein the plurality of reordered subsets comprises a first reordered subset and a second reordered subset;
   interlacing at least one information unit contained in the first reordered subset with at least one information unit contained in the second reordered subset to produce interleaved coded information units;
   wherein the step of subdividing comprises the steps of:
      coding the information units to produce a set of coded information units; and
      subdividing the set of coded information units into a plurality of subsets;
   wherein the step of coding the information units comprises the steps of:
      coding the information units to produce an unpunctured set of coded information units; and
      puncturing the unpunctured set of coded information units to produce a set of coded information units, wherein the at least one of the plurality of subsets that requires a lower probability of bit-error than the other of the plurality of subsets is punctured less than the other of the plurality of subsets.

2. The method of claim 1, wherein the step of coding the information units comprises the steps of:
   splitting the information units into a set of codeable information units and a set of uncoded information units;
   coding the set of codeable information units to produce a set of coded codeable information units; and
   combining the set of coded codeable information units and the set of uncoded information units to produce a set of coded information units.

3. The method of claim 2, wherein the step of combining the set of coded codeable information units and the set of uncoded information units comprises the steps of:
   puncturing the set of coded codeable information units to produce a punctured set of coded codeable information units; and
   combining the punctured set of coded codeable information units and the set of uncoded information units to produce a set of coded information units.

4. A method of transmitting information units by a communication device, the method comprising the steps of:
   providing information units to be transmitted;
   subdividing the information units into a plurality of subsets, wherein the information units subdivided into at least one of the plurality of subsets require a lower probability of bit-error than the information units subdivided into another of the plurality of subsets;
   reordering information units within each subset to produce a plurality of reordered subsets, wherein the plurality of reordered subsets comprises a first reordered subset and a second reordered subset;
   interlacing at least one information unit contained in the first reordered subset with at least one information unit contained in the second reordered subset to produce interleaved coded information units;
   transmitting the interleaved coded information units;
   wherein the step of subdividing comprises the steps of:
      coding the information units to produce a set of coded information units; and
      subdividing the set of coded information units into a plurality of subsets;
   wherein the step of coding information units comprises the steps of:
      coding the information units to produce an unpunctured set of coded information units; and
      puncturing the unpunctured set of coded information units to produce a set of coded information units, wherein the at least one of the plurality of subsets that requires a lower probability of bit-error than the other of the plurality of subsets is punctured less than the other of the plurality of subsets.

5. The method of claim 4, wherein the step of coding the information units comprises the steps of:
   splitting the information units into a set of codeable information units and a set of uncoded information units;
   coding the set of codeable information units to produce a set of coded codeable information units; and
   combining the set of coded codeable information units and the set of uncoded information units to produce a set of coded information units.

6. The method of claim 5, wherein the step of combining the set of coded codeable information units and the set of uncoded information units comprises the steps of:

puncturing the set of coded codeable information units to produce a punctured set of coded codeable information units; and combining the punctured set of coded codeable information units and the set of uncoded information units to produce a set of coded information units.

7. The method of claim 4, wherein the step of transmitting the interleaved coded information units comprises the steps of:

assigning a symbol to the interleaved coded information units; and transmitting the symbol.

8. The method of claim 7, wherein the step of transmitting the symbol comprises the steps of:

modulating the symbol onto a waveform to produce a modulated waveform; and transmitting the modulated waveform.

9. A communication device comprising:

an information source for providing information units to be transmitted;

a processing system, coupled to the information source, capable of receiving the information units, capable of subdividing the information units into a plurality of subsets, wherein the information units subdivided into at least one of the plurality of subsets require a lower probability of bit-error than the information units subdivided into another of the plurality of subsets, capable of reordering information units within each subset to produce a plurality of reordered subsets, wherein the plurality of reordered subsets comprises a first reordered subset and a second reordered subset, capable of interlacing at least one information unit contained in the first reordered subset with at least one information unit contained in the second reordered subset to produce interleaved coded information units, and capable of assigning a symbol to the interleaved coded information units, wherein subdividing by the processing system of the information units comprises coding the information units to produce a set of coded information units and subdividing the set of coded information units into a plurality of subsets, wherein coding by the processing system of the information units to produce a set of coded information units comprises coding information units to produce an unpunctured set of coded information units and puncturing the unpunctured set of coded information units to produce a set of coded information units, and wherein the at least one of the plurality of subsets that requires a lower probability of bit-error than the other of the plurality of subsets is punctured less than the other of the plurality of subsets; and a transmitter, coupled to the processor, capable of transmitting the symbol.

10. The communication device of claim 9, wherein coding by the processing system of the information units to produce a set of coded information units comprises splitting the information units into a set of codeable information units and a set of uncoded information units, coding the set of codeable information units to produce a set of coded codeable information units, and combining the set of coded codeable information units and the set of uncoded information units to produce a set of coded information units.

11. The communication device of claim 10, wherein combining by the processing system of the set of coded codeable information units and the set of uncoded information units comprises puncturing the set of coded codeable information units to produce a punctured set of information units and combining the punctured set of information units and the set of uncoded information units to produce a set of coded information units.

12. The communication device of claim 9, wherein the processing system comprises a processor.

13. The communication device of claim 9, wherein the processing system comprises:

a coder, wherein the coder codes the information units to produce a set of coded information units;

a subdividing interleaver coupled to the coder, wherein the subdividing interleaver subdivides the set of coded information units into a plurality of subsets, reorders information units within each subset to produce a plurality of reordered subsets, and interlaces at least one information unit contained in a reordered subset with at least one information unit contained in a different reordered subset to produce interleaved coded information units; and a symbol coder coupled to the subdividing interleaver, wherein the symbol coder assigns a symbol to the interleaved coded information units.

14. The communication device of claim 13, wherein the subdividing interleaver comprises:

a subdivider, wherein the subdivider subdivides the set of coded information units into a plurality of subsets;

a plurality of interleavers, wherein each interleaver is coupled to the subdivider, and wherein each interleaver reorders information units within a subset to produce a reordered subset; and an interlacer coupled to each interleaver, wherein the interlacer interlaces at least one information unit contained in a reordered subset with at least one information unit contained in a different reordered subset to produce interleaved coded information units.

15. The communication device of claim 13, wherein the processing system further comprises a puncturer coupled between the coder and to the subdividing interleaver, wherein the puncturer punctures the set of coded information units to produce a punctured set of coded information units, and wherein the subdividing interleaver subdivides the punctured set of coded information units into a plurality of subsets.

16. The communication device of claim 13, further comprising:

a splitter coupled between the information source and the coder, wherein the splitter splits the information units into a set of codeable information units and a set of uncoded information units, and wherein the coder codes the set of codeable information units to produce a set of coded codeable information units; and a combiner coupled between the coder and the subdividing interleaver, and further coupled to the splitter, wherein the combiner combines the set of coded codeable information units and the set of uncoded information units to produce a set of coded information units.

17. The communication device of claim 16, further comprising:

a puncturer coupled between the coder and the combiner, wherein the puncturer punctures the coded codeable information units to produce a punctured set of coded codeable information units, and wherein the combiner combines the punctured set of coded codeable information units and the set of uncoded information units to produce a set of coded information units.

* * * * *